United States Patent [19]

Peterson

[11] Patent Number: 4,523,107
[45] Date of Patent: Jun. 11, 1985

[54] SWITCHED CAPACITOR COMPARATOR
[75] Inventor: Joe W. Peterson, Austin, Tex.
[73] Assignee: Motorola, Inc., Schaumburg, Ill.
[21] Appl. No.: 371,110
[22] Filed: Apr. 23, 1982
[51] Int. Cl.[3] .......................... G06G 7/14; H03K 5/22
[52] U.S. Cl. .................... 307/352; 307/362; 330/107; 328/146
[58] Field of Search ................ 328/127, 146, 151; 307/491, 493, 494, 352, 353, 362, 497, 498, 297; 330/9, 107, 51

[56] References Cited
U.S. PATENT DOCUMENTS

| | | | |
|---|---|---|---|
| 3,284,716 | 11/1966 | Chopin | 307/498 |
| 3,497,716 | 2/1970 | Schmid et al. | 328/127 |
| 3,845,398 | 10/1974 | Katz | 307/493 |
| 3,852,674 | 12/1974 | Van Roessel | 307/494 |
| 4,197,472 | 4/1980 | Aoki et al. | 307/297 |
| 4,210,872 | 7/1980 | Gregorian | 330/107 |
| 4,211,942 | 7/1980 | Aoki et al. | 307/584 |
| 4,329,599 | 5/1982 | Gregorian et al. | 307/497 |
| 4,375,595 | 3/1983 | Ulmer et al. | 307/297 |
| 4,425,550 | 1/1984 | Smith et al. | 330/107 |

OTHER PUBLICATIONS

Krummenacher, "Micropower Switched Capacitor Biquadratic Cell", Seventh European Solid State Circuits Conference, Freiburg, Germany, Sep. 22-24, 1981.

Primary Examiner—Stanley D. Miller
Assistant Examiner—Timothy P. Callahan
Attorney, Agent, or Firm—Anthony J. Sarli, Jr.; Jeffrey Van Myers; Robert Lee King

[57] ABSTRACT

A switched capacitor comparator having two or more stages of differential input operational amplifiers utilizing sequentially switched feedback portions and feedback capacitors is provided. The use of feedback capacitors in a sequentially switched comparator provides accurate gain and stability. To further reduce offset voltage errors, a solid state transmission gate having a low "on" resistance is disclosed. A transmission gate having capacitors for partially compensating parasitic capacitance effects, a P-channel device and an N-channel device with a switched tub or substrate is provided to compensate parasitic capacitance effects. When the transmission gate is conducting, the tub or substrate of the N-channel device is switched from one of its current electrodes to a reference potential such as ground. Before the transmission gate is opened electrically, a settling time is provided to allow charge which is coupled from parasitic capacitance to settle.

1 Claim, 7 Drawing Figures

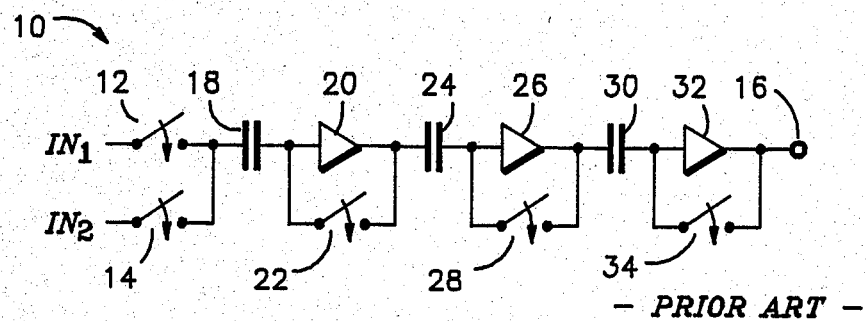
FIG. 1 — PRIOR ART —
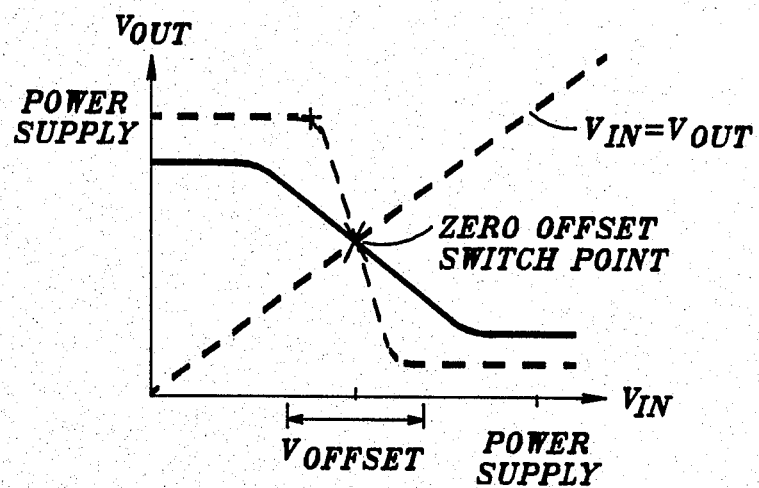
FIG. 2

— PRIOR ART —

SWITCHED CAPACITOR COMPARATOR

CROSS REFERENCE TO RELATED APPLICATIONS

Related subject matter can be found in the following copending application, assigned to the assignee hereof:

Application Ser. No. 1,371,109 entitled "SOLID STATE TRANSMISSION GATE", filed simultaneously herewith by Joe William Peterson.

1. Technical Field

This invention relates generally to comparators and, more particularly, to switched capacitor comparators having amplifiers with sequentially switched feedback means.

2. Background Art

Generally, switched capacitor comparators use several stages of amplification which are capacitively coupled. Some or all of the amplifier stages commonly have a feedback switch coupled between the input and the output thereof which provide sample/hold and compare capability. In order to reduce offset error, such feedback switches are typically switched sequentially. A common problem with comparators of the prior art is the susceptibility of the amplifier stages to noise. Sequential switching often contributes to noise errors resulting from offset voltages created by the switches themselves. A further problem with previous comparators is the inability to accurately set the switchpoint and gain of each amplifier over process and temperature variation. As a result, switch offset voltages are capable of eliminating small signal gain and preventing a gain stage from functioning as a comparator.

SUMMARY OF THE INVENTION

Accordingly, an object of the present invention is to provide an improved, switched capacitor comparator which has improved noise rejection and reduced offset voltage.

Another object of the present invention is to provide an improved switched capacitor comparator which has accurate gain and improved stability over processing and temperature variations.

A further object of the present invention is to provide an improved switched capacitor comparator which has higher speed and resolution than comparators of the prior art.

In carrying out the above and other objects of the present invention, there is provided, in one form, a plurality of capacitively coupled amplifier or gain stages, some or all of which have differential inputs. The gain stages which do have differential inputs have one of the inputs thereof coupled to a reference voltage. Each gain stage has switching means coupled between an output and an input thereof to provide feedback. The switching means are sequentially switched to reduce offset. To provide accurate gain and stability, some or all of the gain stages also have feedback capacitance means coupled in parallel with the switching means.

The above and other objects, features and advantages of the present invention will be more clearly understood from the following detailed description taken in conjunction with the accompanying drawings.

BRIEF DESCRIPTION OF THE DRAWINGS

FIG. 1 illustrates a comparator known in the prior art;

FIG. 2 illustrates in graphical form a gain transfer characteristic of an amplifier stage of a comparator;

DESCRIPTION OF THE PREFERRED EMBODIMENT

Figure 3:
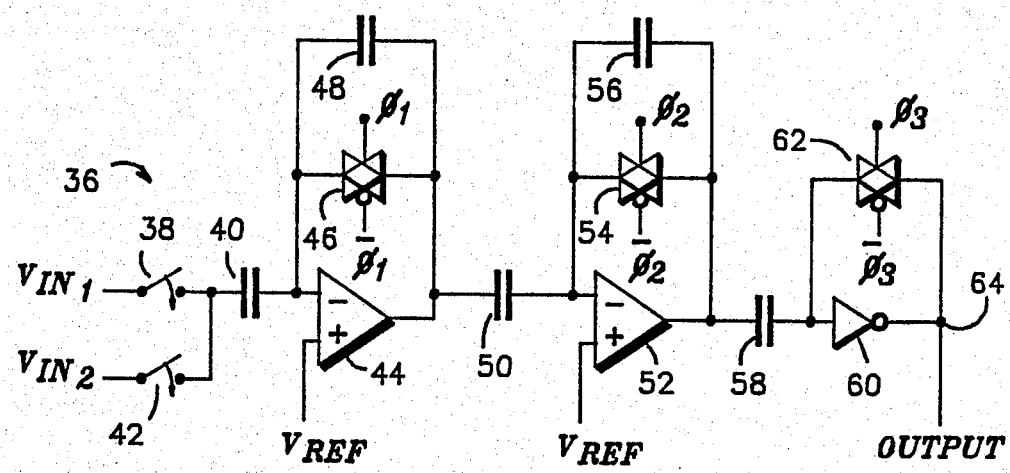
FIG. 3 illustrates in schematic form a switched capacitor comparator constructed in accordance with the preferred embodiment of the present invention.

Shown in FIG. 1 is a comparator 10 known in the art. Comparator 10 is coupled to one of two input voltages $V_{IN1}$ and $V_{IN2}$ via switches 12 and 14. An output voltage at output terminal 16 is proportional to the difference between $V_{IN1}$ and $V_{IN2}$. A coupling capacitor 18 is connected between switches 12 and 14 and an input of amplifier 20. Coupled in parallel with amplifier 20 is a switch 22. A coupling capacitor 24 is connected between an output of amplifier 20 and an input of an amplifier 26. Coupled in parallel with amplifier 26 is a switch 28. A coupling capacitor 30 is connected between an output of amplifier 26 and an input of an amplifier 32. Coupled in parallel with amplifier 32 is a switch 34. An output of amplifier 32 is connected to the output terminal 16. Typically, switches 12, 14, 22, 28 and 34 are MOS transmission gates which are clocked in a conventional manner.

In operation, the circuit of FIG. 1 has a sample/hold mode and a compare mode. During the sample/hold mode, switches 12, 22, 28 and 34 are closed. Each of the amplifiers 20, 26 and 32 is biased to a switchpoint voltage and a charge is established on capacitors 18, 24 and 30. The charge on capacitor 18 is equal to the product of the capacitance of capacitor 18 and the difference in voltage potential between $V_{IN1}$ and the switchpoint of amplifier 20. The charge on capacitor 24 is equal to the product of the capacitance of capacitor 24 and the difference in voltage potential between the switchpoint of amplifier 20 and the switchpoint of amplifier 26. Similarly, the charge on capacitor 30 is equal to the product of the capacitance of capacitor 30 and the difference in voltage potential between the switchpoint of amplifier 26 and the switchpoint of amplifier 32. When switches 22, 28 and 34 are electrically opened, comparator 10 is in a high gain, open loop mode having a switchpoint equal to $V_{IN1}$. Switch 12 is then electrically opened and switch 14 is electrically closed resulting in the output voltage at terminal 16 being at a high logic level if $V_{IN2}$ is less than $V_{IN1}$ and at a low logic level if $V_{IN2}$ is greater than $V_{IN1}$.

In reality, comparator 10 will have no offset voltage and a gain equal to the product of the gain of amplifiers 20, 26 and 32 only if the capacitance value of capacitors 18, 24 and 30 remains constant and charge leakage from capacitors 18, 24 and 30 is negligible. These requirements are adequately met in most MOS circuits. However, another requirement for eliminating offset voltage error is that no additional charge is added or removed from capacitors 18, 24, and 30 while switches 22, 28 and 34 are electrically opening. For conventional MOS transmission gates, this is not possible because parasitic capacitance exists between the gate/source interface and the gate/drain interface of the transistor forming the transmission gate. As a result, a small amount of charge redistribution occurs for each capacitor in comparator 10. This charge redistribution results in an offset voltage which is dependent both on the size of the transmission gate and the total amount of capacitance at the nodes where the transistor terminals are connected.

Conventionally, offset voltage associated with a transmission gate is compensated by coupling an equal, but opposite, charge to an output terminal of the switch via a capacitor fabricated in a tranistor structure and operated from an opposite polarity control signal. If the two transmission gates can be fabricated exactly identical, offset voltage could be eliminated. Since this is not possible, some residual offset voltage will always remain. The offset associated with amplifier 20 is multiplied by the gain of amplifiers 20, 26 and 32 so that the offset at output terminal 16 is no longer negligible. Similarly, the offset associated with amplifier 26 is multiplied by the gain of amplifiers 26 and 32, and the offset associated with amplifier 32 is multiplied by the gain of amplifier 32. To reduce the offset voltage created by the gain amplification of amplifiers 20, 26 and 32, prior art comparators have sequentially switched amplifiers 20, 26 and 32 by sequentially opening switches 22, 28 and 34. As a result, the offset voltage from each amplifier stage is absorbed by the coupling capacitor of the next stage. Therefore, the offset voltage at output terminal 16 becomes the offset voltage of the last amplifier stage multiplied by the gain of only the last amplfier.

However, numerous disadvantages of the comparator of FIG. 1 still exist. In the prior art, amplifiers 20, 26 and 32 are implemented by logic inverters. Although logic inverters are small in size and simple, performance of an inverter varies greatly with changes in temperature and processing. The voltage gain and bias current can easily change by an order of magnitude. Therefore, fast conversion speeds at high temperature are difficult to maintain without sinking large amounts of current at low temperature. Voltage gain variation also creates many problems when the amplifier stages are sequentially switched.

Shown in FIG. 2 is a common voltage transfer curve for an inverting gain stage. The dashed line is a high gain curve and the solid line is a low gain curve. If the gain of an amplifier stage is high, the associated amplified offset voltage may be large enough to drive the output voltage from the linear portion of the curve marked with an "X", for example, up to the supply voltage portion marked with a "+". When the output of a high gain amplifier stage equals the supply voltage, the comparator must force the output of that stage above the supply voltage in order to trip the next amplifier stage. This is impossible and the comparator fails to function. Therefore, the product of offset voltage and amplifier gain must remain low enough to guarantee that the output voltage will remain in the linear operating range of the transfer curve. Since the exact amount of offset voltage is unknown, the maximum amplifier gain must be limited to insure that the output voltage remains linear. Further problems with the comparator of FIG. 1 include the fact that resolution is severely limited due to large variations in gain and susceptibility to power supply noise. Noise on power supply lines is directly coupled into the comparator since the logic inverters are referenced to the supply voltage. In a conventional logic inverter, the gate-to-source voltage of the transistor devices thereof are directly referenced to the power supply. When the gate voltage is constant, noise associated with the power supply is coupled in a directly proportional manner to the inverter. In other words, a 20 millivolt noise disturbance in the power supply will create a 20 millivolt change in the gate-to-source voltage of a coupled transistor.

Figure 4:
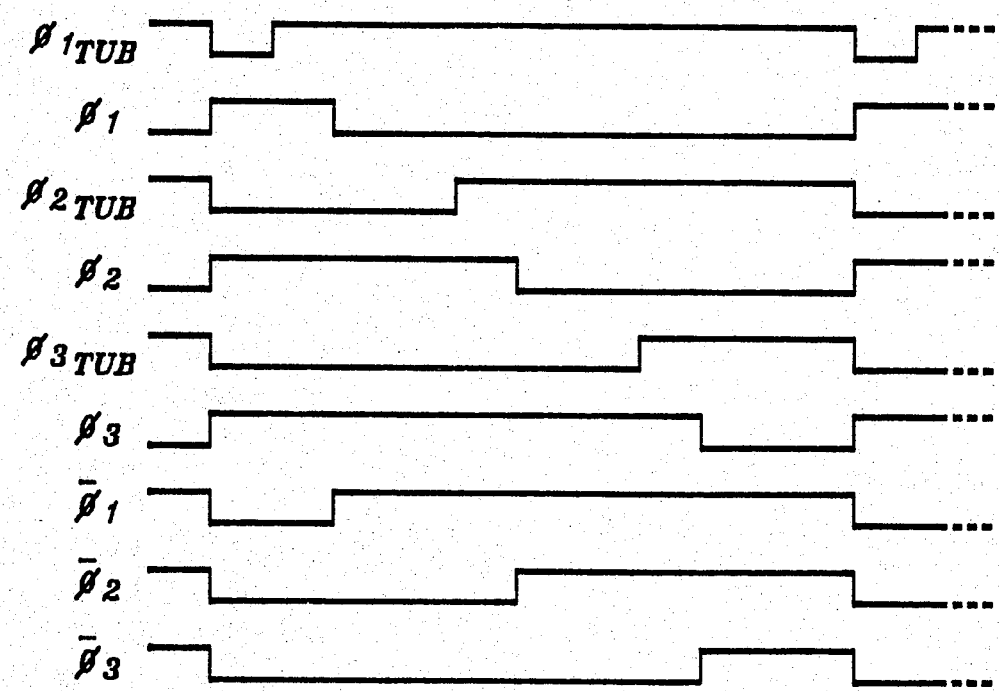
FIG. 4 illustrates in graphical form a timing diagram for the switched capacitor comparator of FIG. 3.

To overcome these problems, a switched capacitor comparator 36 as shown in FIG. 3 may be substituted for the circuit of FIG. 1. In the preferred embodiment, comparator 36 comprises three stages of amplification although the design may be readily expanded to include additional stages of amplifiers. A switch 38 is coupled between a first input voltage $V_{IN1}$ and a first terminal of a coupling capacitor 40. A second switch 42 is coupled between a second input voltage $V_{IN2}$ and the first terminal of coupling capacitor 40. A second terminal of coupling capacitor 40 is coupled to an inverting input of an operational amplifier 44. A noninverting input of operational amplifier 44 is coupled to a reference voltage $V_{REF}$. Coupled between the inverting input and an output of operational amplifier 44 is a switch 46 which is clocked in a conventional manner by a signal $\phi_1$ shown in FIG. 4. A feedback capacitor 48 is coupled in parallel with switch 46. A coupling capacitor 50 has a first terminal connected to the output of operational amplifier 44 and a second terminal connected to an inverting input of an operational amplifier 52. A noninverting input of operational amplifier 52 is coupled to reference voltage $V_{REF}$. Coupled between the inverting input and an output of operational amplifier 52 is a switch 54 which is clocked in a conventional manner by a signal $\phi_2$ shown in FIG. 4. A feedback capacitor 56 is coupled in parallel with switch 54. A coupling capacitor 58 has a first terminal connected to the output of operational amplifier 52 and a second terminal connected to an input of a buffer output stage embodied in the form of an inverter 60. Coupled between the input and an output of inverter 60 is a switch 62 which is clocked in a conventional manner by a signal $\phi_3$ shown in FIG. 4. The output of comparator 36 is provided at terminal 64. The signals of FIG. 4 are provided by conventional clock means (not shown).

In operation, amplifiers 44 and 52 function as differential input comparators. A differential input comparator provides common mode rejection to both positive and negative power supply voltages. Further, the switchpoint of amplifiers 44 and 52 is generated from reference voltage $V_{REF}$ so that the switchpoint is also isolated from power supply noise. Isolating the switchpoint from the power supply prevents the inverting input of each stage from exceeding the power supply voltage. The output voltage of amplifier 44 is approximately $V_{TRIP}44 + (V_{OS}46) \times (A)$, where $V_{TRIP}44$ is the switchpoint of amplifier 44, $V_{OS}46$ is the offset voltage caused by switch 46 and A is the gain of amplifier 44. The voltage potential at the inverting input of amplifier 52 is approximately $V_{TRIP}52 + V_{OS}54$, where $V_{OS}54$ is the offset voltage caused by switch 54 and $V_{TRIP}52$ is the switchpoint of amplifier 52. In the most extreme case, the switchpoint of amplifier 44 is set at mid-scale of the power supply and the voltage swings one-half of the power supply voltage. The voltage potential at the inverting input of amplifier 52 is also going to swing by the same voltage. Therefore, it is critical that the voltage potential at the inverting input of amplifier 52 is the same as the voltage at the output of amplifier 44. Otherwise, the voltage at the inverting input of amplifier 52 may exceed the power supply voltage and leak charge off capacitor 50. Generating the switchpoint of amplifiers 44 and 52 from reference voltage $V_{REF}$ also makes the inverting input of amplifier 52 independent of process variations. As a result, the input signal never needs to be attenuated to keep the comparator functioning. In addition, feedback capacitors 48 and 56 provide very stable gain. Comparator 36 must have a minimum gain which is sufficient to resolve the desired differential input voltage, and yet the maximum gain cannot be so large as to saturate the output with a normal transmission gate offset voltage. The ideal situation is to set the gain of each amplifier stage of comparator 36 close to the maximum limit and thus provide optimum resolution and speed. With a five volt supply voltage, the minimum gain per stage for a one millivolt resolution is approximately $3\sqrt{5}$ V/1 mV or seventeen. The maximum gain per stage possible with a $\pm 50$ mV input offset range is approximately 5V/100 mV or fifty. The gain of operational amplifier 44 is approximately the ratio of the capacitance of capacitors 40 and 48, $C_{40}/C_{48}$, as long as the open loop gain is very high. The gain of operational amplifier 44 can thus be set close to fifty by use of the capacitor ratios which remain very stable over all processing and temperature variations. Similarly, the gain of operational amplifier 52 can be precisely set.

As previously mentioned, a further disadvantage with comparator 10 involves offset voltages created by the transmission gates used to implement switches 22, 28 and 34. Switches 22, 28 and 34 must open electrically or turn "off" without introducing offset voltage caused by capacitive feedthru of the control signals. Also, switches 12, 14, 22, 28 and 34 need to have a low resistance when electrically closed or "on". However, a conventional transmission gate has a nonlinear resistance characteristic which varies as the input signal changes. The maximum resistance typically exists somewhere between $\frac{1}{4}$th and $\frac{3}{4}$ths of the supply voltage used. Since coupling capacitors 18, 24, and 30 must charge through a switch in a minimum amount of time, a low "on" resistance is desirable.

Figure 5:
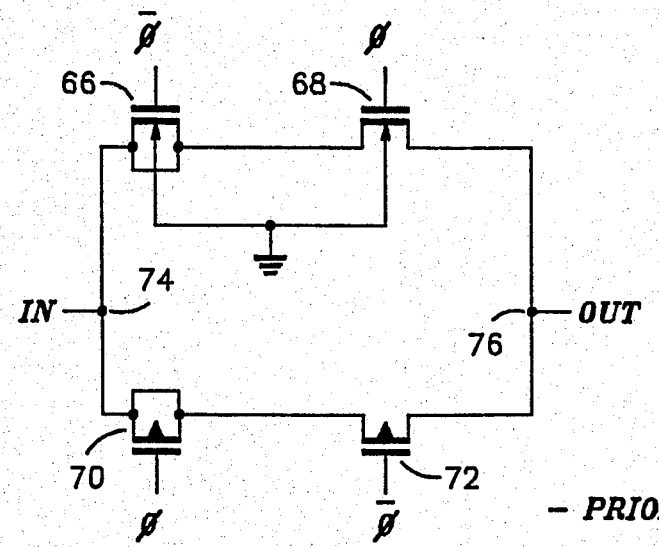
FIG. 5 illustrates in schematic form a transmission gate known in the prior art.

Shown in FIG. 5 is a CMOS transmission gate which is commonly used in the art. N-channel transistors 66 and 68 are connected in series and controlled by complementary signals $\bar{\phi}$ and $\phi$, respectively. The substrate regions of N-channel transistors 66 and 68 are connected to a ground or reference voltage potential. A drain and a source of transistor 66 are connected in a manner so that transistor 66 functions as a capacitor to cancel charge resulting from switching transients which are coupled onto parasitic capacitance associated primarily with transistor 68. It will be understood that the source and drain electrodes of all transistors are interchangeable and that the conductivity type of all transistors may be reversed. Two series connected P-channel transistors 70 and 72 are coupled in parallel with transistors 66 and 68. Transistors 70 and 72 are controlled by complementary signals $\bar{\phi}$ and $\phi$, respectively. A drain and a source of transistor 70 are connected in a manner so that transistor 70 also functions as a capacitor to cancel charge resulting from switching transients which are coupled onto parasitic capacitance. A source of transistor 66 is connected to a drain of transistor 70 to form an input terminal 74. A drain of transistor 68 is connected to a source of transistor 72 to form an output terminal 76. The drain of transistor 66 is connected to a source of transistor 68, and the source of transistor 70 is connected to a drain of transistor 72. Transistors 66 and 70 are capacitive devices used to cancel switching transients created largely by parasitic gate/source and gate/drain overlap capacitances of transistors 68 and 72, respectively, which charge couple switching transients of complementary signals $\phi$ and $\bar{\phi}$. To achieve a desired low "on" resistance, the width of the gate channels of transistors 68 and 72 must be large. However, the width of the gate channels cannot be indiscriminately increased to reduce the "on" resistance because the offset contribution of each transistor is directly proportional to the width of the transistor's gate. Since offset voltage cannot be totally corrected by using a capacitive device, the initial offset voltage must be minimized also. Therefore, the transmission gate of FIG. 5 cannot totally compensate for offset voltage and simultaneously provide a low "on" resistance.

Other transmission gates such as the solid state relay taught in U.S. Pat. No. 3,720,848 by Schmidt, Jr. have used a "switched tub" whereby the tub or substrate of the N-channel transistor of the transmission gate is switched to its source to eliminate the increase in threshold voltage and resulting increase in "on" resistance caused by a reverse source-to-substrate bias. The effect of eliminating the source-to-substrate bias is to minimize the peaking of the resistance curve. When the switch is turned off electrically, the tub of the N-channel transistor is normally switched between the source and a ground reference. Due to the large source-to-tub and drain-to-tub capacitance, switching the tub can couple in much more electrical charge than the gate/source and gate/drain parasitic overlap capacitances and thus produce a large offset voltage.

Figure 6:
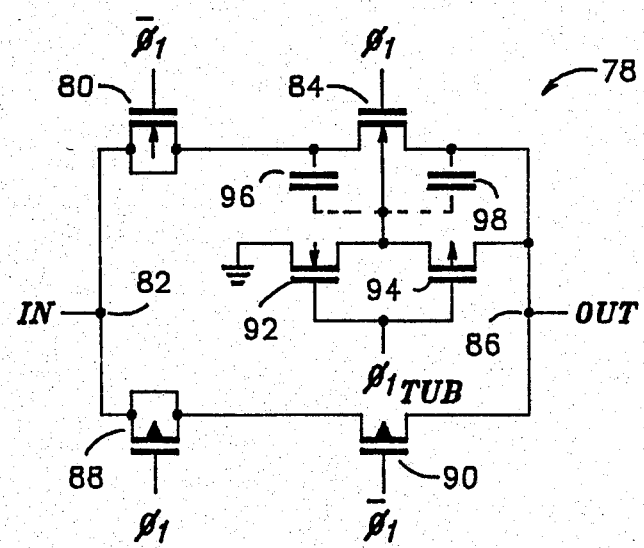
FIG. 6 illustrates in schematic form a transmission gate constructed for use with the preferred embodiment of the present invention.

Shown in FIG. 6 is a transmission gate 78 which overcomes the disadvantages of both the transmission gate of FIG. 5 and also has advantages over the gate taught by Schmidt, Jr. in U.S. Pat. No. 3,720,848. While specific N-channel and P-channel MOS devices are shown, it should be clear that transmission gate 78 could be implemented by completely reversing the processing techniques (E.G. P-channel) or by using other types of transistors. In the preferred form, an N-channel MOS transistor 80 has a drain connected to both an input terminal 82 and the source thereof so that transistor 80 functions as a capacitor. Transistor 80 has the gate thereof coupled to a control signal $\bar{\phi}_1$ shown in FIG. 4 and the source thereof coupled to the drain of an N-channel MOS transistor 84. Transistor 84 has the gate thereof coupled to control signal $\phi_1$ and the source thereof connected to an output terminal 86. A P-channel MOS transistor 88 has the source thereof connected to both input terminal 82 and the drain of transistor 80, and the gate thereof is coupled to control signal $\phi_1$. A drain of transistor 88 is connected to both the source of transistor 88 and a source of a P-channel MOS transistor 90 so that transistor 88 also functions as a capacitor. Transistor 90 has the gate thereof coupled to control signal $\bar{\phi}_1$ and the drain thereof connected to both output terminal 86 and the source of transistor 84. It will be appreciated that transistor 84 may be fabricated with a diffused region or "tub" in a substrate material of opposite conductivity type. An N-channel MOS transistor 92 has the drain thereof connected to both the tub or substrate of N-channel transistor 84 and to the drain of a P-channel MOS transistor 94. Transistors 92 and 94 have the gates thereof connected together and coupled to a control signal $\phi_{1tub}$ also shown in FIG. 4. A source of transistor 92 is connected to ground potential, and the source of transistor 94 is connected to both output terminal 86 and the source of transistor 84. It will also be appreciated that a substantial inherent reverse bias diode capacitance is associated with transistor 84 between a P(−) tub and an N(+) source/drain diffusion. This is shown as a parasitic capacitor 96 between the drain and substrate of transistor 84 and a parasitic capacitor 98 between the source and substrate of transistor 84.

In operation, when control signal $\phi_1$ is at a high logic level, the complement $\overline{\phi}_1$ is at a low level and transistors 84 and 90 are turned "on" and electrically closed. Transistors 80 and 88 will conduct continuously and serve only to cancel switching transients created by parasitic gate overlap capacitances. Simultaneously, as shown in FIG. 4, control signal $\phi1_{tub}$ is at a low logic level. Therefore transistor 94 is "on" and transistor 92 is "off" so that the substrate or tub of transistor 84 is connected to output terminal 86. As a result, a low impedance path is provided to charge reverse bias diode capacitors 96 and 98 and coupling capacitors 40, 50 and 58. When control signal $\phi1_{tub}$ changes state, control signal $\phi_1$ remains the same at a high logic level. Therefore, transistor 92 is now "on" and transistor 94 is "off" so that the tub has been switched from the source of transistor 84 to ground potential. However, transmission gate 78 is still "on" since signal $\phi_1$ keeps transistors 84 and 90 "on". Because the drain to tub capacitance of transistor 84 represented by capacitor 96 is substantial, switching the tub can cause a substantial offset voltage thru charge coupling. This is because charge on capacitor 96 is proportional to the capacitance and voltage associated with capacitor 96. When the voltage potential across capacitor 96 is changed by the switching action, the charge on capacitor 96 also changes. However, a settling time or delay is allowed for the charge on capacitor 96 to discharge thru a relatively high impedance output path. The high impedance output path is through transistors 84 and 90 to output terminal 86 which generally will have a low impedance output load coupled thereto. After the charge created from switching the tub of transistor 84 has been substantially dissipated, signal $\phi_1$ goes to a low logic level and transmission gate 78 turns "off".

Figure 7:
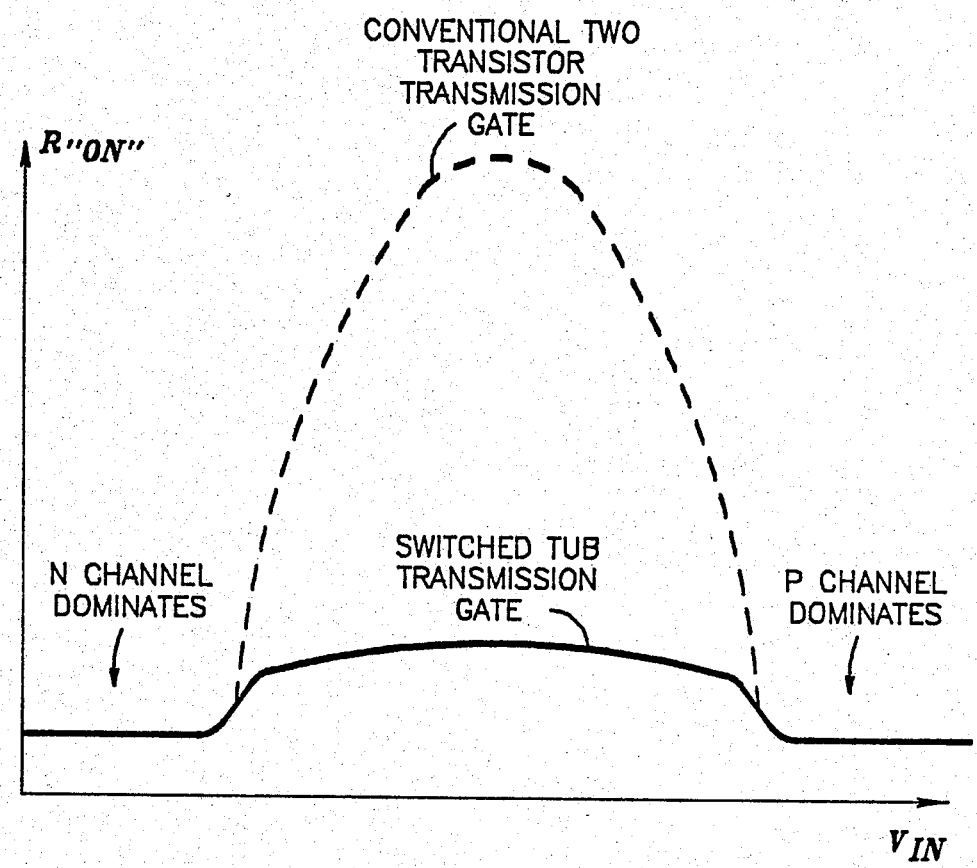
FIG. 7 illustrates in graphical form the input-output resistance characteristic of the transmission gate of FIG. 6 as a function of input voltage.

In a multiple stage comparator such as the comparator of FIG. 3, switches 54 and 62 may also be implemented by transmission gate 78 and controlled by signals $\phi_2$, $\phi2_{tub}$ and $\phi_3$, $\phi3_{tub}$, respectively. Therefore, the charge coupling problem created by the use of a switched tub has been eliminated. It will be appreciated that use of the switched tub N-channel transistor 84 has reduced the "on" resistance of gate 78 as shown in FIG. 7. For low input voltages, the resistance characteristic is dominated by N-channel transistor 84. For high input voltages, the resistance characteristic is dominated by P-channel transistor 90. Switching the tub of N-channel transistor 84 effectively lowers the "on" resistance of gate 78 as shown by the solid curve in FIG. 3. The lower "on" resistance results from eliminating the threshold voltage increase associated with a source-to-substrate back bias. Therefore, the total width of the gate electrodes of all the transistors may be greatly reduced. As a result, undesirable parasitic charge resulting from gate/drain and gate/source overlap capacitances which are coupled to analog circuitry as an offset voltage is substantially reduced. By delaying control signals $\phi_1$ and $\overline{\phi}_1$ until the charge has decayed, the parasitic charge coupling attributed to switching the tub is eliminated. The invention may be practiced without utilizing capacitor connected transistors 80 and 88. However, the use of capacitor connected transistors 80 and 88 further enhances the low voltage error characteristics.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A switched capacitor comparator having an input terminal selectively coupled to a plurality of input voltages for providing an output voltage which is proportional to the difference of said input voltages, comprising:

a first operational amplifier having a noninverting input coupled to a reference voltage, an inverting input and an output;

a first coupling capacitor coupled between said input terminal and the inverting input of said first operational amplifier;

first switching means coupled between the inverting input and output of said first operational amplifier, said first switching means being conductive in response to a first control signal;

a first feedback capacitor coupled between the inverting input and output of said first operational amplifier;

a second operational amplifier having a noninverting input coupled to said reference voltage, an inverting input and an output;

a second coupling capacitor coupled between the inverting input of said second operational amplifier and the output of said first operational amplifier;

second switching means coupled between the inverting input and output of said second operational amplifier, said second switching means being conductive in response to a second control signal;

a second feedback capacitor coupled between the inverting input and output of said second operational amplifier;

an inverter having an input and an output for providing said output voltage;

a third coupling capacitor coupled between the output of said second operational amplifier and the input of said inverter; and third switching means coupled between the input and output of said inverter, said third switching means being conductive in response to a third control signal, and said first, second and third control signals couple and sequentially decouple an output from a predetermined input of each of the first operational amplifier, the second operational amplifier, and the inverter, respectively.

* * * * *